United States Patent
Baransy et al.

(10) Patent No.: US 8,255,851 B1
(45) Date of Patent: Aug. 28, 2012

(54) METHOD AND SYSTEM FOR TIMING DESIGN

(75) Inventors: Anan Baransy, Nazareth Elite (IL); Yaniv Uliel, Kiryat Motzkin (IL)

(73) Assignee: Marvell Israel (M.I.S.L) Ltd., Yokneam (IL)

( * ) Notice: Subject to any disclaimer, the term of this patent is extended or adjusted under 35 U.S.C. 154(b) by 359 days.

(21) Appl. No.: 12/490,758

(22) Filed: Jun. 24, 2009

Related U.S. Application Data (60) Provisional application No. 61/075,185, filed on Jun. 24, 2008.

(51) Int. Cl.
*G06F 17/50* (2006.01)
(52) U.S. Cl. ........................ 716/113; 716/114
(58) Field of Classification Search ............ 716/103, 716/108, 112–114; 703/14, 19
See application file for complete search history.

(56) References Cited

U.S. PATENT DOCUMENTS

| | | | | |
|---|---|---|---|---|
| 7,784,003 | B2 * | 8/2010 | Buck et al. | 716/113 |
| 2004/0122642 | A1 * | 6/2004 | Scheffer | 703/14 |
| 2005/0268263 | A1 * | 12/2005 | Sun et al. | 716/6 |
| 2008/0276212 | A1 * | 11/2008 | Albrecht | 716/10 |

* cited by examiner

*Primary Examiner* — Vuthe Siek
*Assistant Examiner* — Mohammed Alam (57) ABSTRACT

Aspects of the disclosure provide a hold violation correction method that can save design time. The method can be integrated into early stages of electric circuit design instead of correcting hold violations during the final stages of circuit design prior to tape-out. The method can include constructing block-level input/output (IO) timing models for a plurality of circuit blocks that are interconnected, detecting one or more paths between the circuit blocks, adding one or more delay elements on the paths to cause that delays on the paths are within a predetermined delay target range.

16 Claims, 6 Drawing Sheets

METHOD AND SYSTEM FOR TIMING DESIGN

INCORPORATION BY REFERENCE

This application claims the benefit of U.S. Provisional Application No. 61/075,185, "Speculative Hold Buffers" filed on Jun. 24, 2008, which is incorporated herein by reference in its entirety.

BACKGROUND

In circuit design, timing violations, such as setup violations, hold violations, and the like, need to be corrected before generation of final design files for circuit manufacture (tape-out). In an example, hold violations in a circuit can be found using a flat timing model before tape-out. Once detected, the hold violations can be corrected in the final design files by adding delay elements, such as delay cells, buffers, and the like, to the circuit.

SUMMARY

Aspects of the disclosure can provide a violation correction method that can save design time. The method can be integrated into early stages of electric circuit design instead of correcting timing violations during the final stages of circuit design prior to tape-out. The method can include constructing block-level input/output (IO) timing models for a plurality of circuit blocks that are interconnected, detecting one or more paths between the circuit blocks, adding one or more delay elements on the paths between the circuit blocks to cause that delays on the paths are within a predetermined delay target range.

To add the delay elements on the paths, the method can include adding a delay element in a path when a setup slack of the path is larger than a delay value of the delay element.

Additionally, the method can include implementing a clock timing model to provide clocks to the plurality of circuit blocks, and detecting the paths based on the clock timing model and the block-level IO timing models of the plurality of circuit blocks. Alternatively, the method can include detecting the paths based on a skew-free clock tree model that provides identical clocks to the plurality of circuit blocks.

To construct the block-level IO timing models for the plurality of circuit blocks, the method can include constructing the block-level IO timing models based on a first process variation condition, and determining the predetermined delay target range at the first process variation condition.

Further, to determine the predetermined delay target range at the first process variation condition, the method can include determining a delay threshold at a second process variation condition to avoid hold violation at the second process variation condition, and scaling the delay threshold to determine the predetermined delay target range at the first process variation condition. For example, the second process variation condition may correspond to a fast corner of a manufacturing process that may produce circuits with reduced delays, and can be more vulnerable to hold violations; and the first process variation condition may correspond to a slow corner of the manufacturing process that may produce circuits with increased delays. However, at early design stages, the block level IO timing models are usually constructed based on the slow corner. To use the block level IO timing models based on the slow corner to avoid possible hold violations that most likely happen at the fast corner, the method may scale the delay threshold for determining the hold violations at the fast corner and determine the predetermined delay target range for adding delay elements on the paths based on the timing models at the slow corner.

In an embodiment, to construct the block-level IO timing models for the plurality of circuit blocks that are interconnected, the method can include constructing the block-level IO timing models for the plurality of circuit blocks based on static timing analysis.

Aspects of the disclosure can provide a design system for correcting timing violations. The design system can include a block-level input/output (IO) timing module configured to provide block-level IO timing models for a plurality of circuit blocks that are interconnected, a timing violation detecting module configured to detect one or more paths, and a violation correction module configured to add one or more delay elements on the paths to cause that delays on the paths are within a predetermined delay target range.

Further, the violation correction module can be configured to add a delay element in a path when a setup slack of the path is larger than a delay value of the delay element.

In addition, the timing violation detecting module can be configured to receive a clock timing model to provide clocks to the plurality of circuit blocks, and detect the paths based on the clock timing model and the block-level IO timing models of the plurality of circuit blocks. Alternatively, the timing violation detecting module can be configured to detect the paths based on a skew-free clock tree model that provides identical clocks to the plurality of circuit blocks.

In an embodiment, the block-level IO timing module can be configured to provide the block-level IO timing models based on a first process variation condition, and the timing violation detecting module can be configured to detect timing violations at a second process variation condition based on the block-level IO timing models at the first process variation condition.

According to an aspect of the disclosure, the block IO timing module can include a static timing analysis module configured construct the block-level IO timing models for the plurality of circuit blocks based on static timing analysis.

Aspects of the disclosure can provide a computer readable medium storing program instructions for causing a controller to perform timing violation correction steps. The timing violation correction steps can include constructing block-level input/output (IO) timing models for a plurality of circuit blocks that are interconnected, detecting one or more paths between the circuit blocks, and adding one or more delay elements on the paths to cause that delays on the paths are within a predetermined delay target range.

Aspects of the disclosure can also provide an integrated circuit (IC) chip. The IC chip can include delay elements, such as buffers, and the like, that are inserted according to hold violation correction design steps. The hold violation correction design steps can include constructing block-level input/output (IO) timing models for a plurality of circuit blocks that are interconnected, detecting one or more paths between the circuit blocks, and adding one or more delay elements on the paths to cause that delays on the paths are within a predetermined delay target range.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
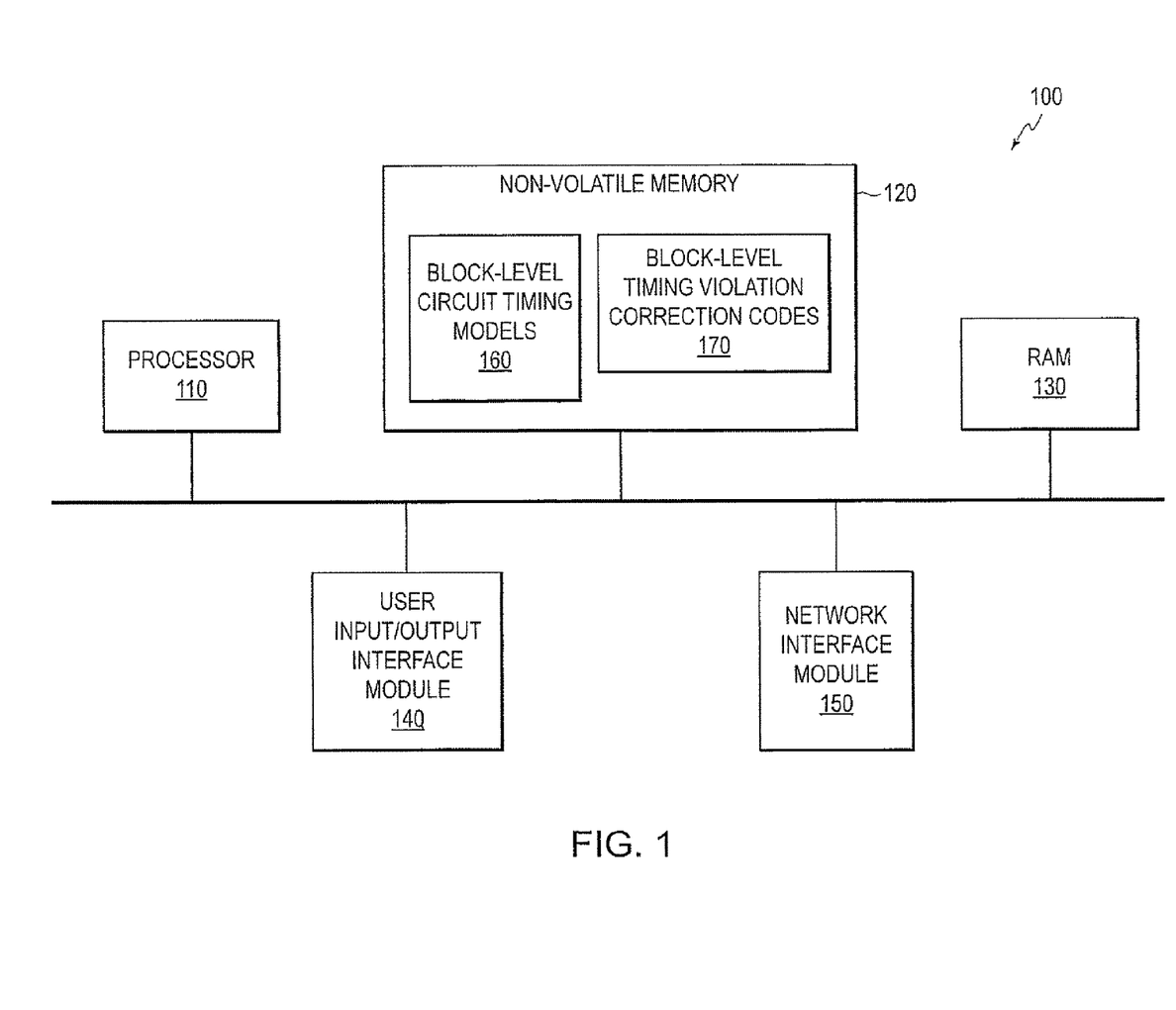
FIG. 1 shows a block diagram of a circuit design system example according to an embodiment of the disclosure.

FIG. 1 shows a block diagram of a circuit design system example according to an embodiment of the disclosure. The circuit design system 100 can include various components, such as a processor module 110, a non-volatile memory unit 120, a random access memory (RAM) unit 130, a user input and output (IO) interface module 140, a network interface module 150, and the like. These elements of the circuit design system 100 can be coupled together as shown in FIG. 1.

The processor module 110 can execute system and application codes. More specifically, the processor module 110 may execute system codes, such as operating system codes, file management codes, and the like, to maintain an appropriate status of the circuit design system 100. Further, the processor module 110 can execute application codes to control the circuit design system 100 to perform specific functions. For example, the processor module 110 may execute codes for performing block-level timing violation correction. Timing violations can happen when a data signal arrives at a capturing device, such as a flip-flop, too early or too late relative to a clock signal. It is noted that the processor module 110 may include one or more processors for performing the required functions. The processors can be coupled together within a computer, or can be distributed in multiple computers and coupled together, for example, via a network, so that several designers may each work in a distributed manner on different parts of a complex circuit design.

The non-volatile memory unit 120 can store system and application codes that generally do not change, such as firmware. In addition, the non-volatile memory 120 may store various data, such as circuit design data. According to an embodiment of the disclosure, the non-volatile memory unit 120 can store block-level circuit timing models 160, such as generated by Primetime from Synopsis, and block-level timing violation correction codes 170. The block-level timing violation correction codes 170 can be executed by the processor module 110 to correct potential timing violations based on the block-level circuit timing models 160 to save design time.

In an example, timing violations of a circuit design, such as hold violations, can be corrected by a flat timing model based timing violation correction design system. The flat timing model based timing violation correction design system may correct timing violations based on, for example, transistor level timing analysis at the end of the design process. In a design example, an IC design system can partition an ASIC logic into multiple macro blocks. Each of the multiple macro blocks may include a portion of the ASIC logic. In addition, a macro block may be coupled to other macro blocks. For example, a macro block may receive inputs from other macro blocks and can relay outputs to other macro blocks. The macro blocks may be designed by different engineers and then integrated.

Further, the IC design system can determine placements and routings for the multiple macro blocks. For each macro block, the IC design system can generate physical circuits corresponding to the logic in the macro block. Additionally, the IC design system may determine a clock network for the multiple macro blocks and correct timing violations before tape-out.

To correct timing violations, the IC design system may flatten the ASIC module, for example, to the transistor level, and perform a timing analysis based on a flat timing model. The timing analysis may detect timing violations, such as setup and/or hold violations, and the like. The hold violations can be corrected by adding delay elements in the ASIC module. Then, the new ASIC module may go through another round of the flat timing model based timing analysis to correct further timing violations.

Generally, an ASIC design may need to go through a number of iterations of the flat timing model based timing analysis to finalize the design. Each iteration of the flat timing model based timing analysis for a complex integrated circuit may take, for example, several days for computation using conventional tools and computers. Thus, multiple iterations of conventional flat timing model based timing violation correction may increase design time.

The block-level timing violation correction codes 170 and the block-level timing models 160 can enable the circuit design system 100 to speculatively add delay cells to correct at least a portion of the hold violations before the flat timing model based timing violation correction. The speculatively added delay cells may be added, for example, to interconnecting communication paths between the different macro blocks during early stages of circuit design. In accordance with an embodiment, the number of speculatively added delay cells, which corresponds to an amount of delay, between macro blocks may be uniform for a particular circuit design. By adding speculative delay cells in this manner, the number of rounds of the flat timing model based timing violation correction can be reduced and design time can be reduced.

The non-volatile memory unit 120 may include various memory media to store the block-level circuit timing models 160 and the block-level timing violation correction codes 170. In an embodiment, the non-volatile memory unit 120 may include semiconductor memory devices, such as electrically programmable read-only memory (EPROM), electrically erasable programmable read-only memory (EEPROM), and the like, that can hold information even when power is off. In another embodiment, the non-volatile memory unit 120 may include a magnetic storage medium, such as a hard drive, that can magnetically store the models and/or the codes. In another embodiment, the non-volatile memory unit 120 may include an optical storage medium, such as compact disc (CD), digital video disc (DVD), and the like, that can optically store the models and/or the codes.

The RAM unit 130 is writeable and readable, and can be accessed at a fast speed. It can be preferred that data and codes are in the RAM unit 130 for the processor module 110 to access during operation. In an example, the circuit design system 100 may include a memory management unit (not shown). The memory management unit can copy codes from the non-volatile memory unit 120 to the RAM unit 130 for the processor module 110 to execute.

The user IO interface module 140 can couple various user input and output devices, such as display, key board, mouse, and the like, to the circuit design system 100. The output devices can provide circuit design outputs, such as locations of delay elements that are inserted in a circuit design, and the like to users. The input devices can enable the users to instruct the circuit design system 100, and control the processor module 110 to execute, for example, the block-level timing violation correction codes 170.

The network interface module 150 can couple the circuit design system 100 to other devices and systems. In an example, the network interface module 150 can couple the circuit design system 100 to a partition and routing system (not shown). The partition and routing system can partition a logic design into circuit blocks, place the circuit blocks in a chip layout and interconnect the circuit blocks with routings. The partition, placement and routing information of the logic design can be provided to the circuit design system 100 via the network interface module 150.

In another example, the network interface module 150 can couple the circuit design system 100 to a static timing analysis system (not shown). The static timing analysis system can provide static timing analysis for the circuit blocks (e.g. within the circuit blocks), and construct block-level circuit timing models for the circuit blocks. The block-level circuit timing models can be provided to the circuit design system 100 via the network interface module 150, and can be stored in the non-volatile memory unit 120.

In another example, the network interface module 150 can couple the circuit design system 100 to a database server (not shown). The database server may store various information, such as manufacturing process information, cell libraries, circuit partitions, placements, routings, and the like. The circuit design system 100 can access the database server to obtain necessary information for performing the block-level timing violation correction operation.

It is also noted that the partition and routing system, the static timing analysis system, the database server, and the like, can be suitably configured as individual systems, or can be suitably configured to be part of the circuit design system 100.

Figure 2:
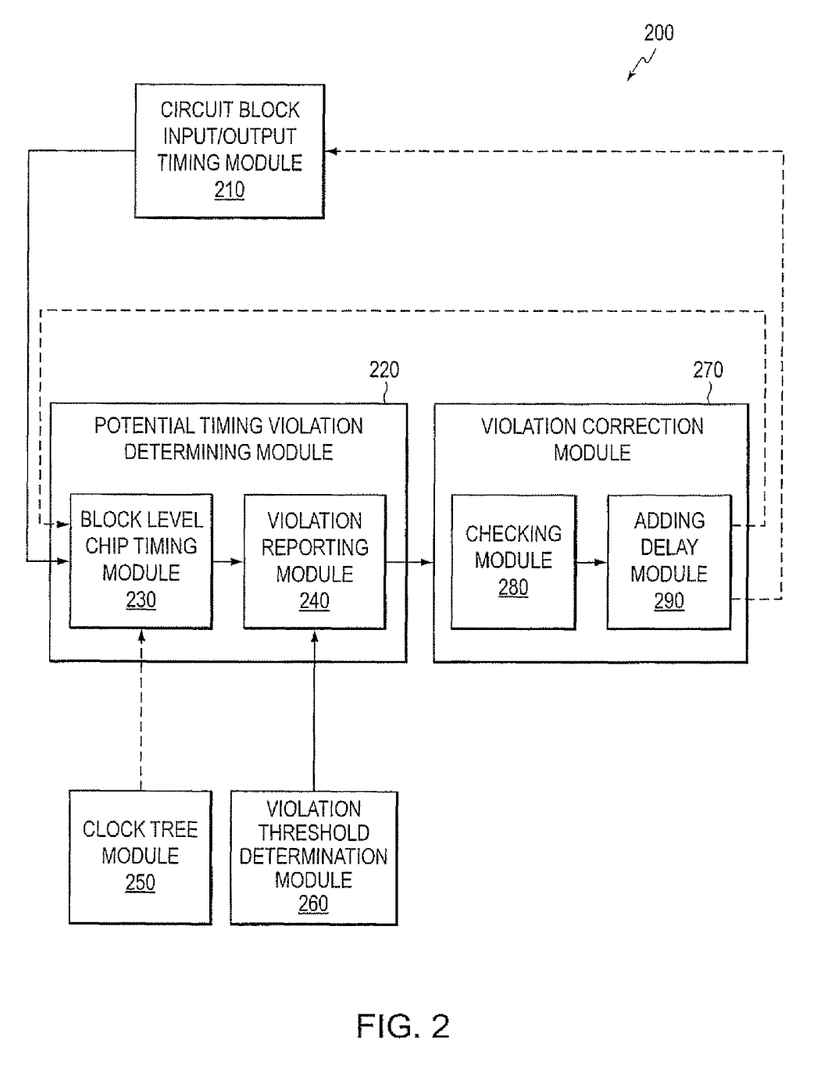
FIG. 2 shows a block diagram of a block-level timing violation correction module example according to an embodiment of the disclosure.

FIG. 2 shows a block diagram of a block-level timing violation correction module example according to an embodiment of the disclosure. The block-level timing violation correction module 200 can include a circuit block IO timing module 210, a potential timing violation determining module 220 and a violation correction module 270. In addition, the block-level timing violation correction module 200 may include a violation threshold determination module 260, and a clock tree module 250. These elements can be coupled together as shown in FIG. 2.

The circuit block IO timing module 210 can provide block-level IO timing models for circuit blocks in a circuit design. In an example, the circuit design may start with a logic design that can be generated by, for example, a hardware description language, such as verilog, very high speed IC hardware description language (VHDL), and the like. Then, the logic design can be partitioned into multiple circuit blocks. Each circuit block can include a portion of the logic design, and the multiple circuit blocks can be interconnected. For example, a first circuit block can have input nodes that receive inputs from a second circuit block, and can have output nodes that provide its outputs to the second circuit block, or other circuit blocks.

In an embodiment, the circuit block IO timing module 210 may include a timing analysis tool that can generate block level IO timing models for the circuit blocks in the circuit design. In an example, the circuit block IO timing module 210 may include a static timing analysis tool, such as Primetime, and the like. The static timing analysis tool can respectively provide a block-level IO timing model for a circuit block according to a static timing analysis of the circuit block. The block-level IO timing model may include timing specifics for the input nodes and the output nodes of the circuit block at specific manufacturing conditions.

In an example, the circuit block may include an input node that provides a data input to a flip-flop inside the circuit block. The block-level IO timing model may include setup/hold requirements for the input node at a slow corner. The slow corner can correspond to a manufacturing process variation condition that can produce the circuit block having a reduced speed.

In another example, the circuit block may include an output node that can be a logic combination of multiple nodes within the circuit block. The multiple nodes may change the value of the output node via different paths. The block-level IO timing model may include delays of the longest path and shortest path at the slow corner for the output node.

The potential timing violation determining module 220 can be configured to determine potential timing violation paths between the circuit blocks, such as from an output node to an input node of another circuit block, based on the block-level IO timing models. The potential timing violation determining module 220 can further include a chip timing module 230 and a violation reporting module 240.

The block level chip timing module 230 can construct a timing model, which can be referred as a chip timing model, that includes block-level timing models for the multiple circuit blocks, and models for their interconnections. It is noted that the chip timing model may include a portion of a chip, such as an application specific integrated circuits (ASIC) portion of the chip. It is also noted that the models for the interconnections may include models for wires, transistors, resistors, and the like, that can be configured to couple the multiple circuit blocks.

In an embodiment, the chip timing module 230 can incorporate a clock tree model in the chip timing model. The clock tree model can be configured to provide clocks to the multiple circuit blocks. In an example, the chip timing module 230 may receive a clock tree model from the clock tree module 250, and can construct the chip timing model based on the clock tree model. In another embodiment, the chip timing module 230 can construct the chip timing model for the multiple circuit blocks based on an ideal clock tree model that assumes skew-free clocks to the multiple circuit blocks.

The violation reporting module 240 can determine potential timing violation paths based on the chip timing model, and can provide the potential timing violation paths to the violation correction module 270 to correct the timing violations. In an embodiment, the violation reporting module 240 can determine potential hold violation paths based on the chip timing model.

In an example, the chip timing model can be constructed based on the block-level timing models at the slow corner, the violation reporting module 240 may use the chip timing model to determine the potential hold violation paths for various process variation conditions. In an embodiment, the violation reporting module 240 may use a threshold to determine potential violation paths. For example, when a delay on a path is smaller than the threshold, the path can be a potential hold violation path. The threshold can be calculated to ensure a positive hold slack at various process variation conditions, such as a fast corner. A hold slack can be referred as a delay margin to avoid hold violation. When a hold slack of a path at a process variation condition is positive, the path does not have a hold violation for the process variation condition. The fast corner can correspond to a process variation condition that can produce the circuit design with an increased speed, thus can have a reduced hold slack. In an embodiment, the threshold can be calculated by the violation threshold determination module 260.

The violation correction module 270 can receive the report of the potential timing violation paths, and adjust the circuit design to prevent the potential timing violations. In an embodiment, the report can include potential hold violation paths, and the violation correction module 270 can insert delay elements in the circuit design to prevent the hold violations.

The violation correction module 270 can further include a checking module 280 and an adding delay module 290. The checking module 280 can be configured to check a setup slack of a potential hold violation path and determine whether the path has enough setup slack for adding a delay element. The setup slack can be referred as a delay margin for a path to avoid setup violation. In an example, the checking module 280 may determine a minimum delay to prevent the hold violation, and compare the setup slack with the minimum delay. When the setup slack of the path is larger than the minimum delay, a netlist of the path can be provided to the adding delay module 290 to add delay elements. On the other hand, when the setup slack of the path is smaller than the minimum delay, the hold violation correction for the path can be performed at a later design stage, such as a flat-timing model based violation correction stage.

In another embodiment, when the setup slack of the path is smaller than the minimum delay, the checking module 280 may back-trace nodes inside the circuit block that drives the path, and determine to add delay elements in the circuit block. It is noted that when delay elements are inserted inside of a circuit block, the block-level timing model for the circuit block may need to be updated before next round of block-level hold violation correction.

The violation threshold determination module 260 may provide a threshold for the violation reporting module 240 to determine timing violations. In an embodiment, timing violations may happen at a process condition that is different from the process condition used in the block-level circuit timing models. In an example, the block-level circuit timing models can be constructed based on the slow corner of a manufacturing process, however hold violations may happen at the fast corner of the manufacturing process. The violation threshold determination module 260 may determine a threshold to determine potential hold violations at the slow corer, such that paths with delays larger than the threshold can not have hold violations at the fast corner of the manufacturing process.

In an example, the violation threshold determination module 260 may determine a first threshold for the slow corner, such that paths with delays larger than the first threshold at the slow corner can not have hold violations at the slow corner. Then, the violation threshold determination module 260 may scale the first threshold by a scale factor, for example, between 2.5 and 3, to obtain a second threshold, such that paths with delays larger than the second threshold at the slow corner can not have hold violations at the fast corner.

In an embodiment, the violation threshold determination module 260 can determine the first threshold based on assumptions. In an example, the violation threshold determination module 260 may assume ideal clock distribution for circuit blocks, such that the input clocks for the circuit blocks can be skew-free. Then, the violation threshold determination module 260 may assume that clock skews within a circuit block can be balanced. Further, the violation threshold determination module 260 may assume a variation of the clock, such as an on-chip-variation (OCV) of the clock. Thus, the first threshold can be calculated by Eq. 1

$$\text{threshold} = \text{launching\_clock\_skew} + \text{capturing\_clock\_skew} + \text{OCV} \qquad \text{Eq. 1}$$

where launching_clock_skew denotes a maximum skew on a slow side by a launch flip-flop, and the capturing_clock_skew denotes the maximum skew on a fast side by a capture flip-flop, and OCV denotes the on chip variation. For example, when clocks within a circuit block are balanced at ±100 ps, and the on chip variation is 100 ps, the first threshold can be 300 ps at the slow corner. Thus, if the scale factor is 3, the second threshold can be 900 ps.

The clock tree module 250 can provide a clock tree model for the block-level chip timing module 230 to build the chip timing model. In an embodiment, the clock tree model may be constructed based on a clock tree design. In another embodiment, the clock tree model can be an ideal clock model, which can assume a skew-free clock input for each of the circuit block.

During operation, for example, the circuit block IO timing module 210 can provide block-level IO timing models for circuit blocks in a circuit design to the potential timing violation determining module 220. In an example, the block-level IO timing models may be constructed based on a slow corner of a manufacturing process. The potential timing violation determining module 220 can build a chip timing model that can include the block-level IO timing models and a clock tree model that can distribute clocks to the circuit blocks. In an example, the clock tree model can be a skew-free clock tree model that can distribute identical clocks to the circuit blocks.

Further, the potential timing violation determining module 220 may determine potential timing violations, such as potential hold violation paths, based on the chip timing model. In an example, the potential hold violation paths can be determined by comparing a hold slack at the slow corner to a threshold. The threshold can be determined by the violation threshold determination module 260 in such a manner that if the hold slack of a path at the slow corner is larger than the threshold, the hold slack of the path at the fast corner can be positive.

Then, the potential hold violation paths can be corrected by the violation correction module 270. The violation correction module 270 can receive the report of the potential hold violation paths, and insert delay elements in the circuit design to prevent the potential hold violations. In an example, the violation correction module 270 may check a setup slack of a potential hold violation path and determine whether the path has enough setup slack for adding a delay element. When the setup slack is enough, the violation correction module 270 may speculatively add one or more delay elements in the path and suitably configure the one or more delay elements. In an example, the violation correction module 270 may add the delay element close to the receiving circuit block, and can suitably size the delay element. Moreover, the magnitude of delay between circuit blocks may be standardized to be within tolerances such that at least some of the violations between circuit blocks are corrected without being so great as to cause other violations. In an embodiment of the disclosure, such delays between circuit blocks may be introduced, for example, on a speculative basis during early design stages. The precise tweaking of delay to correct actual violations, such as setup and hold violations, may be conducted at a later design stage based on a flat timing model, for example. The number of violations following the addition of speculative delay buffers between circuit blocks typically will be reduced.

When the delay elements are added between the circuit blocks, the new circuit design may be provided to the potential timing violation determining module 220 to start another round of block-level timing violation correction. However, when a delay element is added within a circuit block, the new circuit block may be provided to the block IO timing module 210 to update the block-level timing model for the circuit block. Then, the updated block-level timing model can be used for another round of block-level timing violation correction.

Figure 3A:
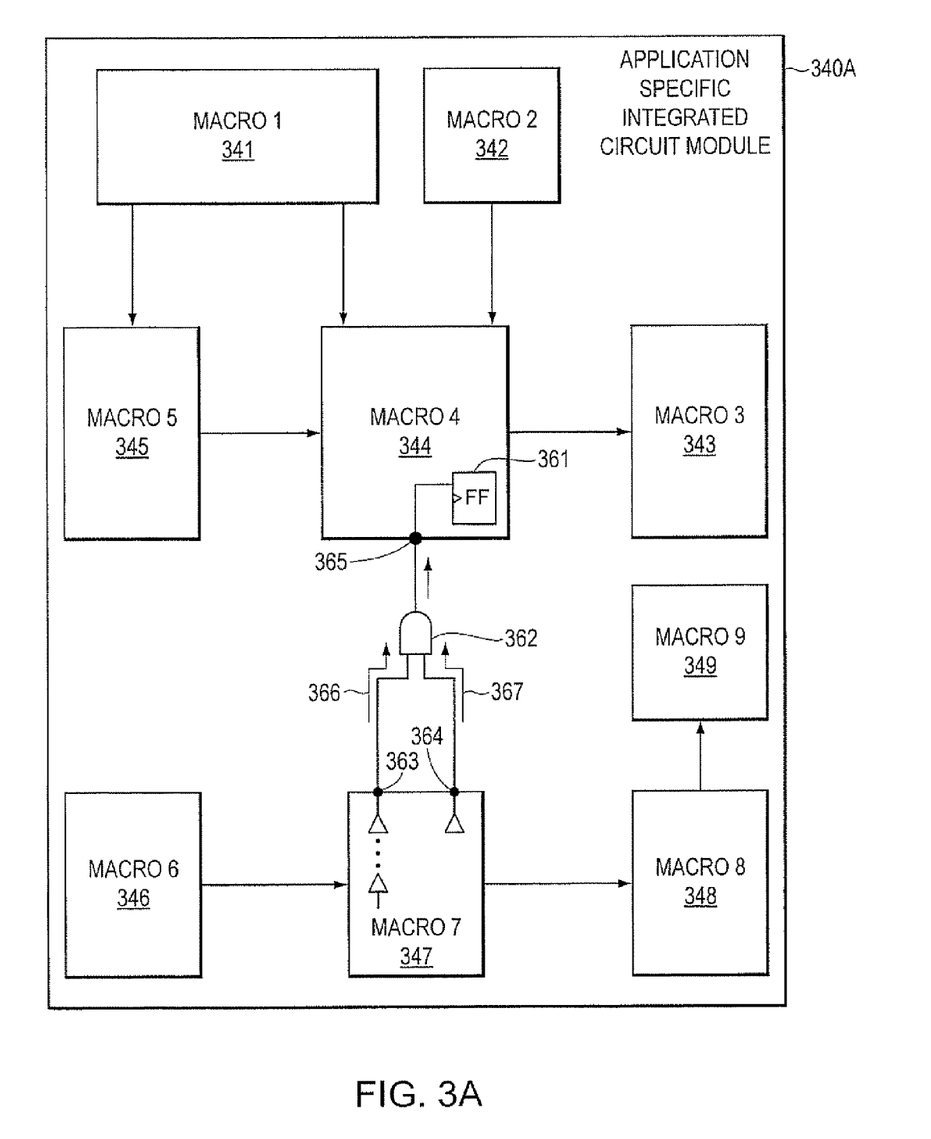
FIGS. 3A and 3B show plots of a circuit example at intermediate design stages according to an embodiment of the disclosure.
Figure 3B:
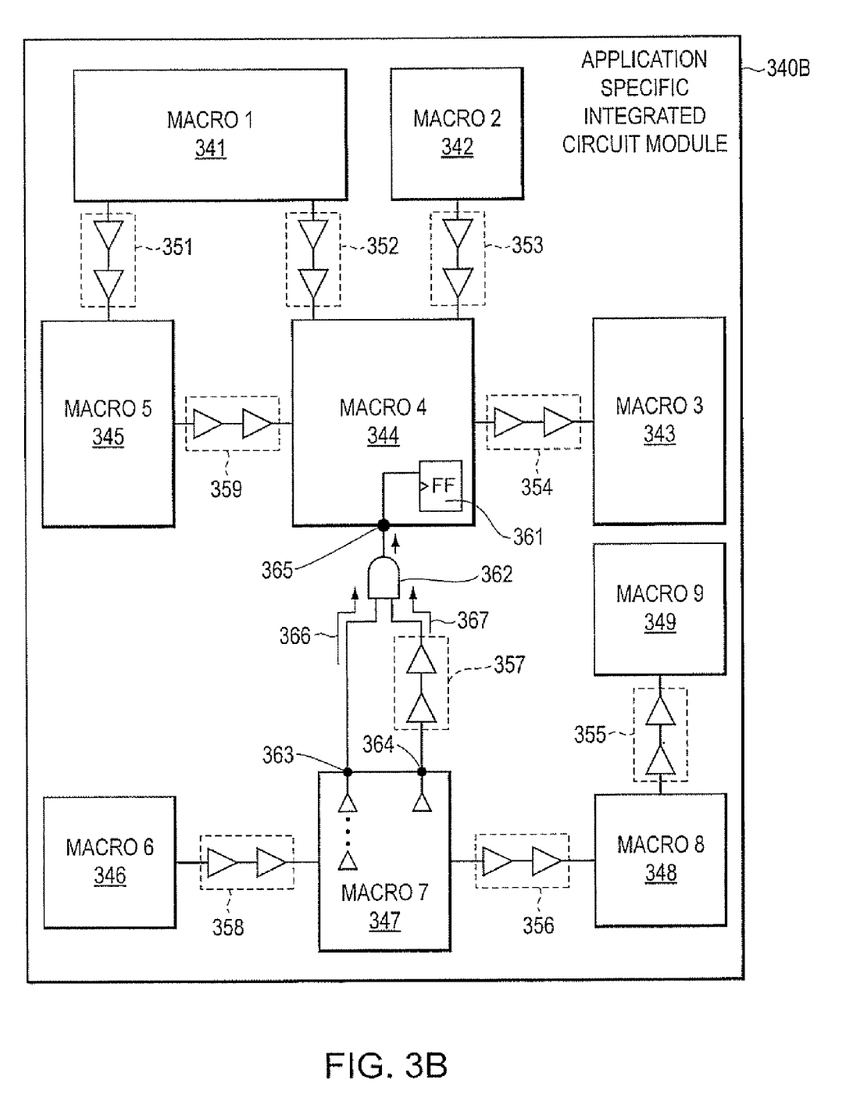

FIGS. 3A and 3B show plots of an ASIC circuit design example at intermediate design stages according to an embodiment of the disclosure. FIG. 3A shows the plot of the ASIC circuit design 340A at a block-level, and FIG. 3B shows the plot of the ASIC circuit design 340B with delay elements added based on block-level hold violation correction.

In FIG. 3A, the ASIC circuit design 340A can include a plurality of macro blocks 341-349. The plurality of macro blocks 341-349 can be interconnected. For example, the macro block 344 may include an input node 365 that provides an input to an internal flip-flop 361 for capturing data, for example. The input can be provided by other macro blocks. In the FIG. 3A example, the macro block 347 can include two output nodes 363 and 364 to provide data that is input at node 365. The output node 363 can change the input along a path 366, and the output node 364 can change the input along a path 367.

Each macro block can be modeled in the form of a black box model, and the input nodes and output nodes of the macro block can include timing specifics. In an embodiment, the timing specifics can be constructed for one or more process conditions, such as a slow corner of a manufacturing process, a fast corner of the manufacturing process, a typical corner of the manufacturing process and the like. In an example, the plurality of macro blocks 341-349 can be constructed by a static timing analysis tool, such as Primetime, and the like, based on, for example, the slow corner of the manufacturing process. For example, the input node 365 may include setup and hold requirements at the slow corner, and the output nodes 363 and 364 may include a longest path delay and a shortest path delay at the slow corner.

FIG. 3B shows the plot of the ASIC circuit design 340B with delay elements 351-359 added in the potential hold violation paths. The delay elements 351-359 may be implemented using various delay mechanisms, such as buffers, and delay cells. The delay elements 351-359 can be respectively configured to provide necessary delay for respective paths. For example, the transistor sizes of the delay elements 351-359 can be respectively configured.

It is noted that the delay elements 351-359 can be implemented in the ASIC module 340B based on the block-level timing models of macro blocks 341-349, and before the ASIC circuit design 340B is flattened for flat timing model based timing analysis. In accordance with an embodiment, the delay elements 351-359 may be speculatively added during the design process without first precisely determining the actual delay requirements for each circuit block or for any given net.

In the FIG. 3B example, the path 367 can be determined as a potential hold violation path based on the timing specifics of the output node 364, the input node 365, and a timing model of the path 367. Then, the delay element 357 can be suitably added in the path 367.

According to an embodiment of the disclosure, the delay elements 351-359 can be implemented in the ASIC circuit design 340B before the flat timing model based timing analysis. Thus, the number of rounds of the flat timing model based timing analysis can be reduced, and thus the design time can be saved.

Figure 4:
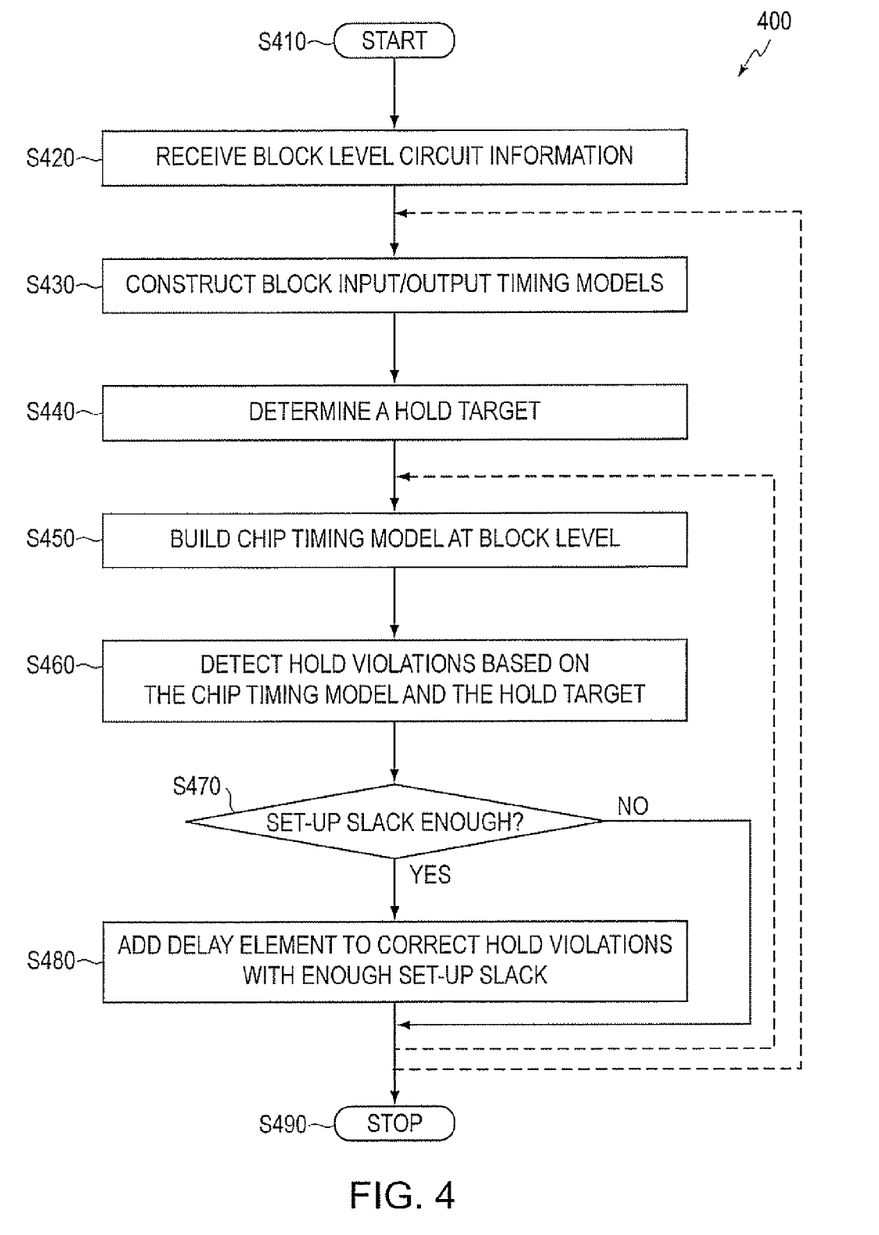
FIG. 4 shows a flow chart outlining a process example for hold violation correction according to an embodiment of disclosure.

FIG. 4 shows a flow chart outlining a process example 400 for hold violation correction according to an embodiment of disclosure. The process starts at step S410, and proceeds to step S420.

In step S420, a design system, such as the design system 100, may receive block level circuit information. In an example, a circuit design may start with a logic design that can be generated by, for example, a hardware description language, such as verilog, very high speed IC hardware description language (VHDL), and the like. Then, the logic design can be partitioned into multiple circuit blocks. Each circuit block can include a portion of the logic design, and the multiple circuit blocks can be interconnected. For example, a first circuit block can have input nodes that receive inputs from a second circuit block, and can have output nodes that provide its outputs to the second circuit block, or other circuit blocks. The partition information of the circuit blocks can be provided to the design system. Additionally, the design system may receive other block level circuit information, such as placement information and routing information of the circuit blocks. Then, the process proceeds to step S430.

In step S430, the design system may construct block level IO timing models for the multiple circuit blocks. In an example, the design system may include a static timing analysis tool, such as Primetime, and the like. The static timing analysis tool can respectively provide a block-level IO timing model for a circuit block according to a static timing analysis of the circuit block. The block-level IO timing model may include timing specifics for the input nodes and the output nodes of the circuit block at specific manufacturing conditions.

In an example, the circuit block may include an input node that provides a data input to a flip-flop within the circuit block. The block-level IO timing model may include setup/hold requirements for the input node at a slow corner of a manufacturing process. The slow corner can correspond to a variation condition of the manufacturing process that can produce the circuit block having a reduced speed.

In another example, the circuit block may include an output node that can be a logic combination of multiple nodes within the circuit block. Each of the multiple nodes can change the output via different paths. The block-level IO timing model may include delays of the longest path and shortest path at the slow corner for the output node. Then, the process proceeds to step S440.

In step S440, the design system may determine a hold target to determine timing violations. In an embodiment, timing violations may happen at a process condition that is different from the process condition used in the block-level circuit timing models. In an example, the block-level circuit timing models can be constructed based on the slow corner of the manufacturing process, and hold violations may happen at a fast corner of the manufacturing process. Thus, the design system may determine a first threshold at the slow corer to determine the potential hold violation at the slow corner. Then, the design system may scale the first threshold with a scaling factor, such as a value between 2.5 and 3, to obtain the hold target, and use the hold target to determine the potential hold violation at the fast corner based on timing models at the slow corner. Then, the process proceeds to step S450.

In step S450, the design system can construct a timing model, which can be referred as a chip timing model, that includes block-level models for the multiple circuit blocks, and models for their interconnections. It is noted that the chip timing model may include a portion of a chip, such as an application specific integrated circuits (ASIC) portion of the chip. It is also noted that the models for the interconnections may include models for wires, transistors, resistors, and the like, that can be on the paths to couple the multiple circuit blocks.

In an embodiment, the chip timing model can be built based on an ideal clock tree model that assumes skew-free clocks to the multiple circuit blocks. Then, the process proceeds to step S460.

In step S460, the design system can determine potential hold violation paths based on the chip timing model and the hold target. In an example, the design system may calculate a hold slack for each path based on the chip timing model at the slow corner. Further, the design system may compare the hold slacks with the hold target. When the hold slack of a path is less than the hold target at the slow corner, the path can be determined to be potential hold violation path at the fast corner. Then, the process proceeds to step S470.

In step S470, the design system can check a setup slack of a potential hold violation path and determine whether the path has enough setup slack for adding a delay element. In an example, the design system may determine a minimum delay to prevent the hold violation, and compare the setup slack with the minimum delay. When the setup slack is larger than the minimum delay, the process proceeds to step S480; otherwise, the process proceeds to step S490, and terminate.

In step S480, the design system can add delay elements in the potential hold violation path. In an embodiment, the design system can suitably size a delay element, and add the delay element in the path, for example, close to the input node of the receiving circuit block. Then the process proceeds to step S490 and terminates.

It is noted that the process may return to S450 or S430 to start another round of the block-level timing violation correction process. In an example, when delay elements are inserted on paths between the circuit blocks, the process may return to S450 to update the chip timing model to start another round of the block-level timing violation correction. In another example, the design system may insert delay elements within a circuit block, for example, by back-tracking nodes in the circuit block. Then, the process may return to S430 to update the circuit block timing model to start another round of the block level timing violation correction. It is noted that at a later stage in the design process, typically prior to tapeout, the circuit design may be flattened and precise timing analysis may be performed on the entire circuit, or part thereof. Delay elements may be added and removed in order to tweak timing performance and avoid residual timing violations that may remain despite (or because of) any delay elements previously added between circuit blocks. These additional steps are similar to conventional timing adjustments and are not shown.

Figure 5:
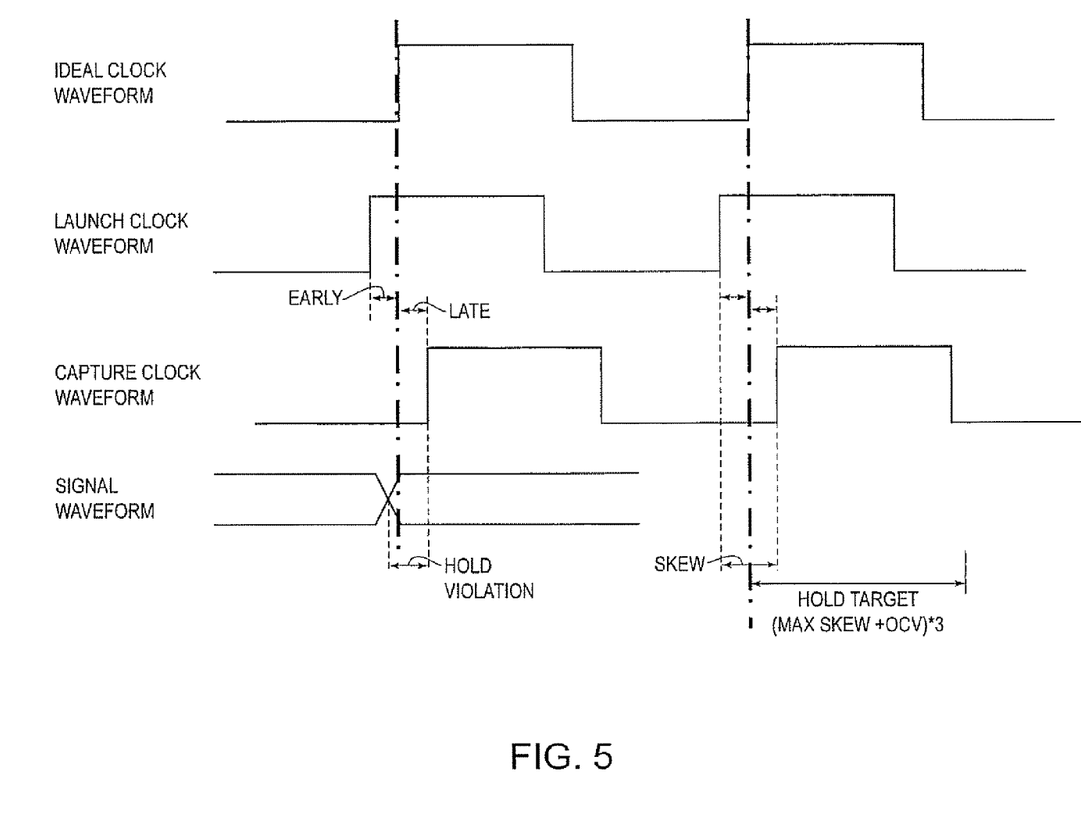
FIG. 5 shows a plot of waveform examples according to an embodiment of the disclosure.

FIG. 5 shows a plot of waveform examples according to an embodiment of the disclosure. The waveform examples can include an ideal clock waveform, a launch clock waveform, a capture clock waveform and a signal waveform. According to an embodiment of the disclosure, clock signals with the ideal clock waveform can be assumed for the macro blocks. Within macro blocks, clock signals can be assumed to balance between a negative maximum within macro clock skew that is earlier than the ideal clock and a positive maximum within macro clock skew that is later than the ideal clock. Therefore, a worst case clock skew may occur between a first circuit block (macro block) and a second macro block. The first macro block may include a launch flip-flop that outputs a data signal onto a path between the first macro block and the second macro block. The launch flip-flop may receive a clock signal shown by the launch clock waveform, which can arrive earlier than the ideal clock waveform for the negative maximum within macro clock skew. The second macro block may include a capture flip-flop that receives the data signal from the path. The capture flip-flop may receive a clock signal shown by the capture clock waveform, which can arrive later than the ideal clock waveform for the positive maximum within macro clock skew.

Then, when the path delay is small, the data signal, which can be shown by the signal waveform, may travel faster than the clock signal to the capture flip-flop, and may cause hold violation, as shown in FIG. 5. According to an embodiment of the disclosure, delay elements can be added into the path between the first macro block and the second macro block to avoid the hold violation. The delay elements can be configured to add delay to the path, such that hold violation at the faster corner can be avoided. For example, the delay elements can be configured to add a delay, such that the path delay at the fast corner can be larger than a delay threshold, which can be a sum of a maximum skew between the launch clock waveform and the capture clock waveform, and an on chip variation (OCV) of the clock signals, to avoid the hold violation.

In addition, the delay elements can be added based on block-level timing models of the macro blocks, which can be constructed based on the slow corner. To configure the delay of the delay elements at the slow corner, the delay threshold can be scaled, for example, by a scaling factor 3, as shown by the hold target in FIG. 5. Thus, the delay elements can be configured to add a delay, such that the path delay at the slow corner can be larger than the hold target. In an embodiment, the delay elements can be added to cause the path delay within a predetermined delay target range, such as 2.5 to 3 times of the delay threshold, and the like.

It is noted that the waveforms in the FIG. 5 are not drawn to scale.

While the invention has been described in conjunction with the specific embodiments thereof that are proposed as examples, it is evident that many alternatives, modifications, and variations will be apparent to those skilled in the art. Accordingly, embodiments of the invention as set forth herein are intended to be illustrative, not limiting. There are changes that may be made without departing from the spirit and scope of the invention.

What is claimed is:

1. A method for correcting hold time violations in an electronic circuit design, comprising:
   constructing block-level input/output (IO) timing models by a processor at a first process variation condition for a plurality of circuit blocks that are interconnected;
   determining a delay target range at the first process variation condition to avoid hold time violation at a second process variation condition;
   detecting one or more paths between the circuit blocks; and
   adding one or more delay elements on the paths to cause delays on the paths to be within the delay target range.

2. The method of claim 1, wherein adding the delay elements on the paths to cause the delays on the paths to be within the delay target range, further comprises:
   adding a delay element in a path when a setup slack of the path is larger than a delay value of the delay element.

3. The method of claim 1, further comprising:
   implementing a clock timing model to provide clocks to the plurality of circuit blocks; and
   detecting the paths based on the clock timing model and the block-level IO timing models of the plurality of circuit blocks.

4. The method of claim 1, wherein detecting the paths between the circuit blocks, further comprises:
  detecting the paths based on a skew-optimized clock tree model that provides clocks with substantially identical timing to the plurality of circuit blocks.

5. The method of claim 1, wherein determining the delay target range at the first process variation condition to avoid hold time violation at the second process variation condition further comprises:
  determining a delay threshold at the second process variation condition to avoid hold time violation at the second process variation condition; and
  scaling the delay threshold to determine the delay target range at the first process variation condition.

6. The method of claim 1, wherein constructing the block-level IO timing models at the first process variation condition for the plurality of circuit blocks that are interconnected, further comprises:
  constructing the block-level IO timing models at the first process variation condition for the plurality of circuit blocks based on static timing analysis at the first process variation condition.

7. A design system for correcting hold time violations for capturing signals, comprising:
  a block-level input/output (IO) timing module configured to provide block-level IO timing models at a first process variation condition for a plurality of circuit blocks that are interconnected;
  a violation threshold determination module configured to determine a delay target range at the first process variation condition to avoid hold time violation at a second process variation condition;
  a timing violation detecting module configured to detect one or more paths between the circuit blocks; and
  a violation correction module configured to add one or more delay elements on the paths to cause delays on the paths to be within the delay target range.

8. The design system of claim 7, wherein the violation correction module is further configured to add a delay element in a path when a setup slack of the path is larger than a delay value of the delay element.

9. The design system of claim 7, wherein the timing violation detecting module is further configured to receive a clock timing model to provide clocks to the plurality of circuit blocks, and detect the paths based on the clock timing model and the block-level IO timing models of the plurality of circuit blocks.

10. The design system of claim 7, wherein the timing violation detecting module is further configured to detect the paths based on a skew-optimized clock tree model that provides clocks with substantially identical timing to the plurality of circuit blocks.

11. The design system of claim 7, wherein the violation threshold determination module is further configured to determine a delay threshold at the second process variation condition, and scale the delay threshold to determine the delay target range at the first process variation condition.

12. The design system of claim 7, wherein the block IO timing module further comprises:
  a static timing analysis module configured to construct the block-level IO timing models at the first process variation condition for the plurality of circuit blocks based on static timing analysis.

13. A non-transitory computer readable medium storing program instructions for causing a controller to perform timing violation correction steps, comprising:
  constructing block-level input/output (IO) timing models at a first process variation condition for a plurality of circuit blocks that are interconnected;
  determining a delay target range at the first process variation condition to avoid hold time violation at a second process variation condition;
  detecting one or more paths between the circuit blocks; and
  adding one or more delay elements on the paths to cause delays on the paths to be within the delay target range.

14. The non-transitory computer readable medium of claim 13, wherein the step to add the delay elements on the paths to cause the delays on the paths to be within the delay target range, further comprises:
  adding a delay element in a path when a setup slack of the path is larger than a delay value of the delay element.

15. The non-transitory computer readable medium of claim 13, wherein the steps further comprise:
  implementing a clock timing model to provide clocks to the plurality of circuit blocks; and
  detecting the paths based on the clock timing model and the block-level IO timing models of the plurality of circuit blocks.

16. The non-transitory computer readable medium of claim 13, wherein the step to construct the block-level IO timing models at the first process variation condition for the plurality of circuit blocks that are interconnected, further comprises:
  constructing the block-level IO timing models at the first process variation condition for the plurality of circuit blocks based on static timing analysis.

* * * * *